United States Patent [19]
Hong

[11] Patent Number: 5,994,745
[45] Date of Patent: Nov. 30, 1999

[54] ROM DEVICE HAVING SHAPED GATE ELECTRODES AND CORRESPONDING CODE IMPLANTS

[75] Inventor: Gary Hong, Hsin-chu, Taiwan

[73] Assignee: United Microelectronics Corp., Hsinchu, Taiwan

[21] Appl. No.: 08/428,766

[22] Filed: Apr. 24, 1995

Related U.S. Application Data

[62] Division of application No. 08/224,697, Apr. 8, 1994, Pat. No. 5,429,967.

[51] Int. Cl.⁶ ....................................................... H01L 27/11
[52] U.S. Cl. ............................................ 257/390; 257/903
[58] Field of Search ...................... 257/903, 904, 257/390, 391

[56] References Cited

U.S. PATENT DOCUMENTS

| | | | |
|---|---|---|---|
| 4,328,563 | 5/1982 | Schroeder | 257/391 |
| 4,959,812 | 9/1990 | Momodomi et al. | 365/185 |
| 4,974,042 | 11/1990 | Ashida et al. | 257/390 |
| 5,063,170 | 11/1991 | Okuyama | 25/390 |
| 5,067,001 | 11/1991 | Choi | 257/390 |
| 5,081,052 | 1/1992 | Kobayashi et al. | 437/29 |
| 5,094,971 | 3/1992 | Kanebako | 437/52 |
| 5,149,667 | 9/1992 | Choi | 437/52 |
| 5,587,600 | 12/1996 | Yang | 257/391 |

*Primary Examiner*—David B. Hardy
*Attorney, Agent, or Firm*—Rabin & Champagne, P.C.

[57] ABSTRACT

A process of fabricating a mask type ROM is described wherein second type impurity ions are implanted into a semiconductor substrate having a first opposite type background impurity to form a depletion region adjacent the surface. A plurality of parallel nitride lines are formed on the surface, and a first gate oxide formed on the spaces between the nitride lines. Subsequently, a first layer of doped polycrystalline silicon is deposited over the nitride lines, and the layer etched back to expose the top surfaces of the nitride lines. After the nitride lines are removed, a thin gate oxide layer is formed on the exposed surface of the substrate, and on the surfaces of the resultant first polycrystalline gate electrode lines. A second layer of doped polycrystalline silicon is deposited over the polycrystalline silicon lines, and it is etched back. The etch back of the first, and also the second polycrystalline silicon layers, produces an elongated central depression in each of the resultant lines. Then a layer of insulating material is deposited over the surface. A photoresist layer is deposited on the surface of the insulating layer exposed, and developed to define the desired code implant pattern.

6 Claims, 4 Drawing Sheets

ROM DEVICE HAVING SHAPED GATE ELECTRODES AND CORRESPONDING CODE IMPLANTS

This application is a divisional of application Ser. No. 08/224,697, filed Apr. 8, 1996, now U.S. Pat. No. 5,429,967.

BACKGROUND OF THE INVENTION

(1) Field of the Invention

The present invention relates to semiconductor read only memory (ROM) devices, and more particularly to a mask ROM device having not and (NAND) type high integration double polycrystalline silicon word lines and the process for producing.

(2) Description of the Invention

A mask ROM is a read only memory device that is unable to change data after the data is filed by a process of making code implants, i. e. implanting impurity ions to alter the threshold voltage of selected memory cells. The ROM device structure is simple, and the degree of integration is the highest among semiconductor memory devices. These factors have make the mask ROM a very popular device for various computer and other related applications.

Mask programed ROM's are known in the art and used in various applications. U.S. Pat. No. 5,081,052 discloses a ROM which consists of an array of FET's arranged in columns and rows, interconnected by word and bit lines. At each intersection of the word and bit lines, is a FET, which constitutes a single memory cell. These FETs can be tailored to be either conducting or non-conducting, which can arbitrarily be assigned a 1 or 0 value. The tailoring of the memory cells can be done by programming, where the FET includes a "floating gate", or by selectively ion implanting impurity ions into the channel area of the FET, thereby changing the device channel region from a depletion mode to an enhancement mode. U.S. Pat. No. 5,081,052 describes this type of mask ROM device and the procedure for "code implanting" to tailor the device array. U.S. Pat. No. 5,094,971 describes a generally similar type ROM device.

An important objective in fabricating memory devices is to increase the miniaturization in order to increase the number of memory cells in the device. As the size of the individual cells decreases, the implantation of impurities (code implants) becomes more difficult. The definition of the necessary openings in a resist layer mask, becomes harder to achieve, as well as the registration of the mask used to expose the code pattern in the resist. The code implant must be located very accurately in order that final implant after diffusion does not overlap another memory cell. What is needed in order to increase miniaturization of ROM memories, are better techniques to code implant, and improved techniques to fabricate smaller word lines.

SUMMARY OF THE INVENTION

It is an object of this invention to provide an improved process for fabricating mask type ROM devices having more accurately located code implants.

It is another object of this invention to provide a mask type ROM device having improved word lines which can be made very narrow.

It is yet another object of the invention to provide a method of fabricating a ROM device wherein the code implants are self aligned.

In accordance with the above objectives, there is presented a process of fabricating a mask type ROM device wherein second type impurity ions are implanted into a semiconductor substrate having a first opposite type background impurity to form a thin depletion region adjacent the surface. A plurality of thin parallel nitride lines are formed on the surface, and a thin first gate oxide formed on the spaces between the nitride lines. Subsequently, a first layer of doped polycrystalline silicon is deposited over the nitride lines, and the layer etched back to expose the top surfaces of the nitride lines. After the nitride lines are removed, a thin gate oxide layer is formed on the exposed surface of the substrate, and on the surfaces of the resultant first polycrystalline gate electrode lines. a second layer of doped polycrystalline silicon is deposited over the polycrystalline silicon lines, and it is etched back. The etch back of the first, and also the second polycrystalline silicon layers, produces an elongated central depression in each of the resultant lines. Then a layer of insulating material is deposited over the surface. a photoresist layer is deposited on the surface of the insulating layer, exposed, and developed to define the desired code implant pattern.

Impurity ions of a first type impurity are implanted into this substrate through the code implant openings using an energy to pass through the exposed central depressions in the polycrystalline lines.

A mask type ROM device is presented having a depletion layer of a second type impurity adjacent to surface of a semiconductor substrate with a background impurity of a first opposite type. A gate oxide is provided on the top surface of the substrate. A plurality of spaced elongated parallel gate electrodes of polycrystalline silicon, each provided with a longitudinal elongated central depression, are disposed over the gate oxide.

Insulation means provides electrical insulation for the gate electrodes. Code implant regions are provided in the substrate in registry with the central impressions.

BRIEF DESCRIPTION OF THE DRAWINGS

The foregoing and other objects as well as advantages of the present invention will become clear by the following description of the invention with reference to the accompanying drawings, wherein.

DETAILED DESCRIPTION OF THE INVENTION

Figure 1:
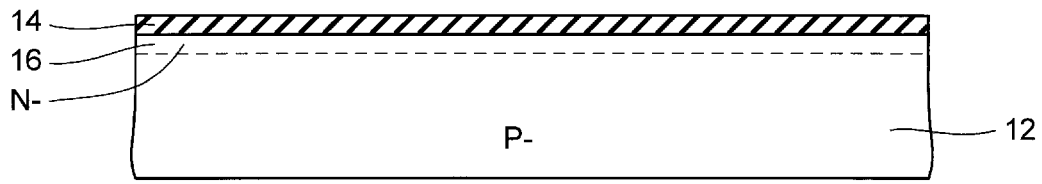
FIGS. 1 through 10, are a sequence of cross sectional views, in broken section that illustrates the process of fabricating the ROM device of the invention.

Referring now to the drawings, there is illustrated in FIG. 1, a semiconductor substrate 12 provided with a P type background impurity. Typically the substrate is monocyrstalline silicon with a <100> surface crystal orientation, as defined by the Miller indices. However, other suitable semiconductor substrates can be used such as germanium, gallium arsenide, silicon carbide, etc. The background impurity can be either N or P type, typically P type with a concentration of about 5E14 to 5E16 $cm^{-3}$. Normally, field oxide regions, (not shown) with underlying channel stopper regions are fabricated in the substrate, as is well known. A pad oxide layer 14 is formed or deposited on the surface of substrate 12. Layer 14 is typically $SiO_2$ with a thickness in the range of 100 to 500. It can be formed by thermal oxidation process.

Figure 2:
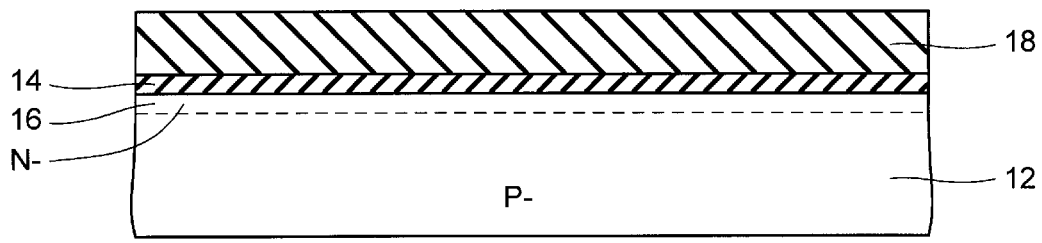
Figure 3:
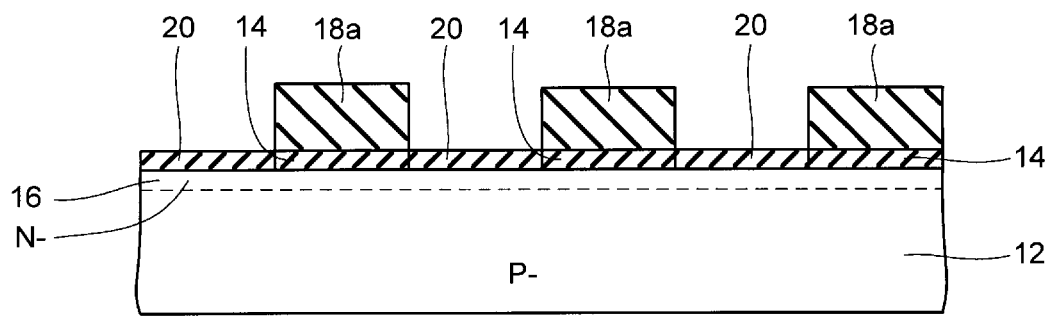

A depletion region 16 is then formed by implanting an N type impurity through layer 14 into substrate 12. Region 16 typically has a depth of 0.1 to 0.4 µm, and can be formed by implanting As ions into the substrate with an acceleration voltage of 50 Kev. with a dosage of $1 \times 10^{13}/cm^2$. This will normally produce a depletion region with a threshold voltage on the order of minus 3 volts. As shown in FIG. 2, a nitride layer 18 is deposited over layer 14. Layer 18 has a thickness on the order of 4000 Angstroms and can be formed by LP-CVD or PE-CVD. As shown in FIG. 3, layer 18 is patterned to form a plurality of thin elongated spaced lines 18a, where the width of the lines is approximately equal to the spacing. The width of lines 18a is in the range of 0.3 µm to 0.8 µm. Patterning of layer 18 can be done by conventional photolithographic and etching techniques. After the lines 18a have been patterned, the exposed areas of layer 14 are removed, and a gate oxide layer 20 formed. Gate oxide 20 has a thickness in the range of 80 to 200 Angstroms, and is typically formed by oxidizing the exposed silicon substrate in an oxygen atmosphere, at a temperature of 800° C. to 900° C.

Figure 4:
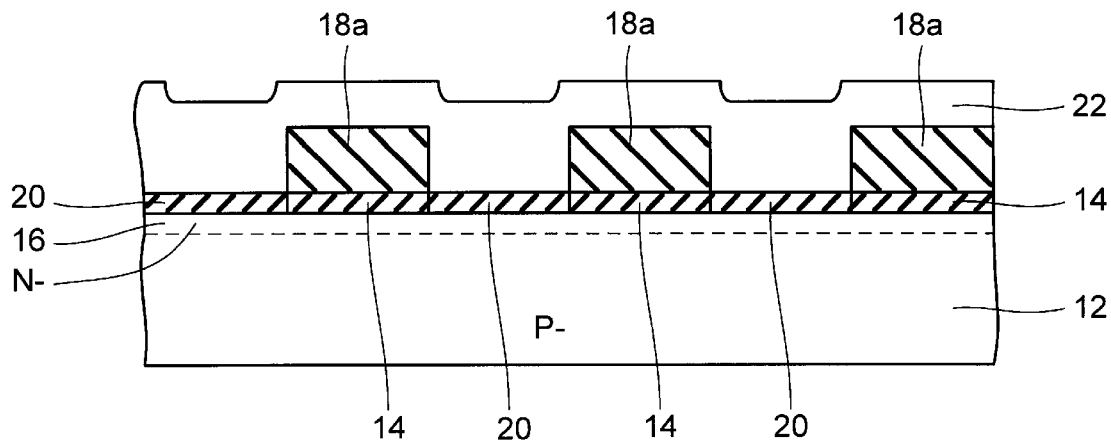

As shown in FIG. 4, a first doped polycrystalline silicon layer 22 is deposited over lines 18a and gate oxide layer 20. The impurity dopant can be introduced during or following deposition. Layer 22 should have a thickness of 2000 to 4000 Angstroms, as measured over lines 18a. Note that the layer 22 follows generally the contours of the surface defined by the lines 18a and spaced areas over layer 20. Layer 22 is deposited by LPCVD method.

Figure 5:
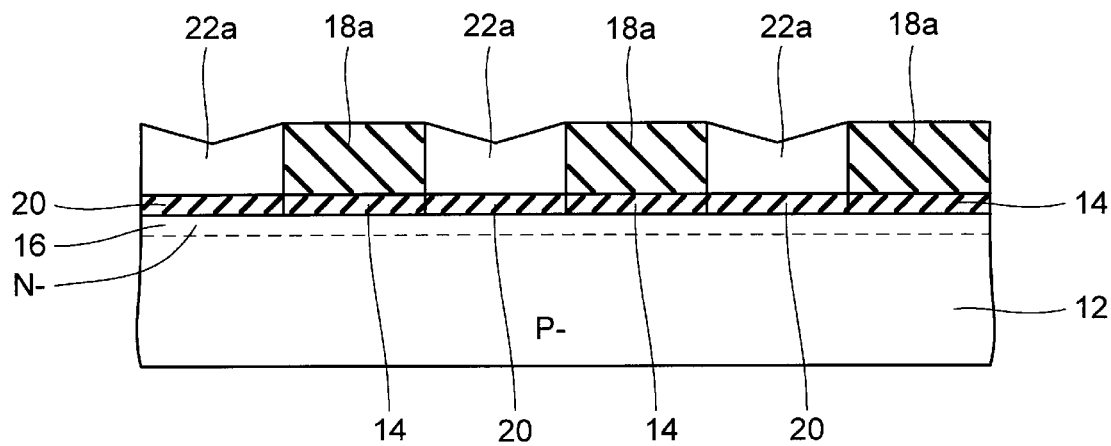

As shown in FIG. 5 layer 22 is etched back to expose the top surface of nitride lines 18a. This leaves portions of layer 22 between nitride lines 18a that constitute the first gate electrode lines 22a. Note that the surface contour of layer 22 is preserved in the top surfaces of lines 33 and leaving an elongated central depression. The etch back of layer 22 can be done by anistropic plasma etching process, Ie. Reactive Ion Etching (RIE).

If desired, a thin polycide layer can be deposited on the surface of lines 22a to improve the conductivity of the lines. A layer of a refractory metal, for example Tungsten, is deposited on the top surfaces of the lines 22a and heated to form Tungsten silicide.

Figure 6:
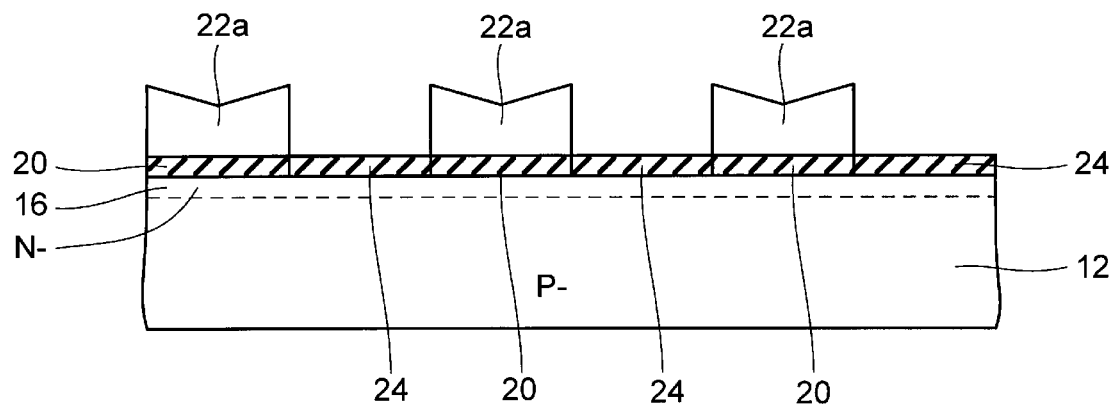
Figure 7:
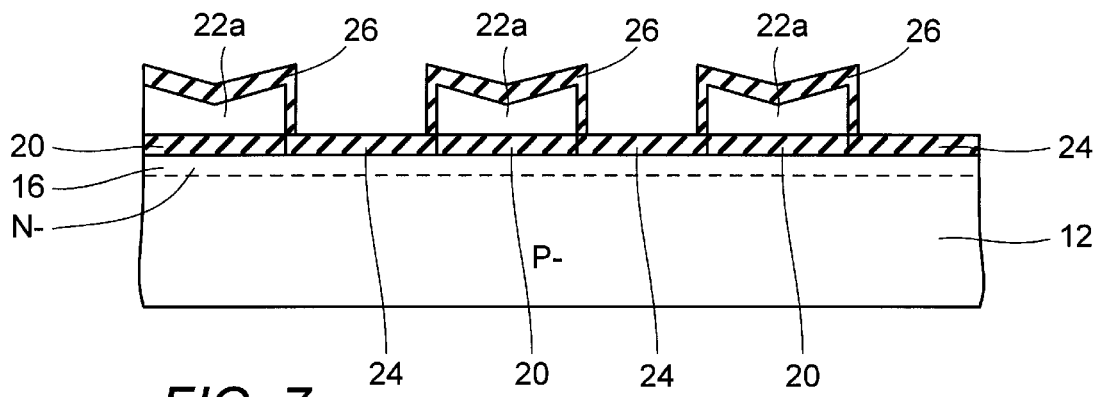

As shown in FIG. 6, the nitride lines 18a are removed leaving lines 22a. The nitride lines can be removed by phophoric acid. Subsequently the portions of layer 14 under lines 18a are also removed by selective etching and a gate oxide layer 24 formed. Layer 14 can be removed by Buffer HF solution. As shown in FIG. 7, a thin insulating layer 26 is formed over the surface of lines 22a. The layer 26 can be formed by oxidizing the lines which can be done when layer 24 is formed. Polycide can be oxidized thermally as well.

Figure 8:
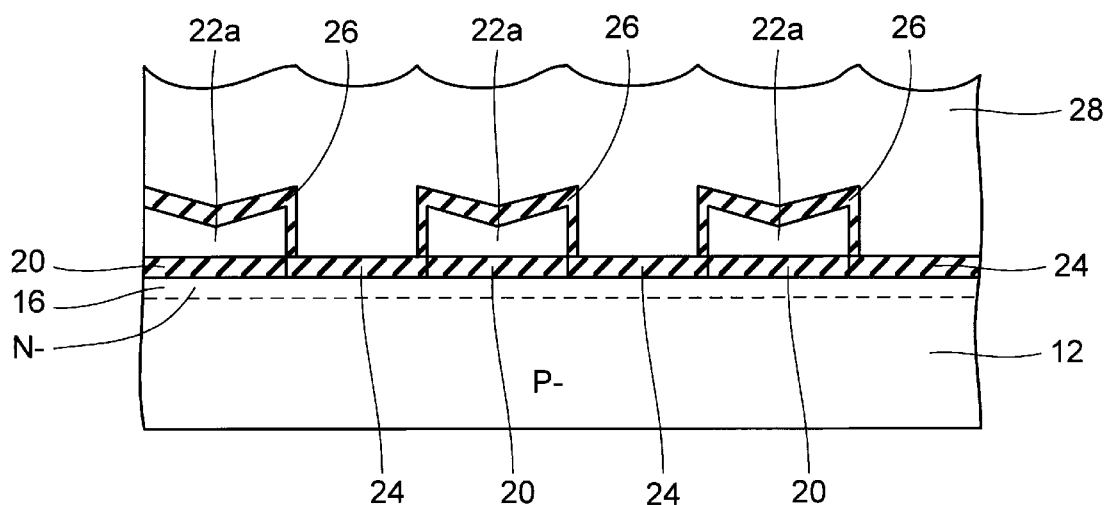
Figure 9:
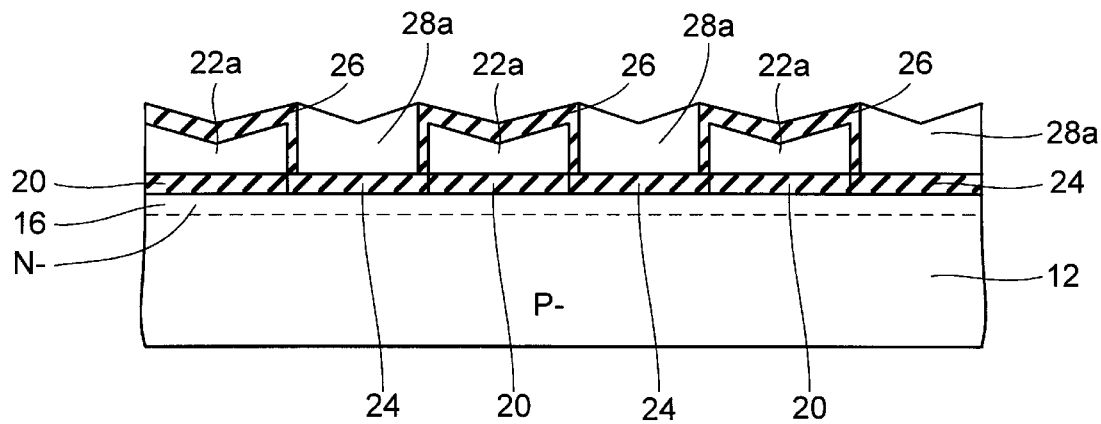

A second polycrystalline silicon layer 28 is deposited over lines 22a and layer 24, as shown in FIG. 8. Note that the top surface of layer 28 also generally follows the contour of the top surface of the substrate. Layer 28 has the same general thickness of layer 22 and is deposited in the same manner. Layer 28 is then etched back in the same manner as layer 22 to expose the gate electrode lines 22a, as shown in FIG. 9. This leaves a second set of gate electrode lines 28a between gate electrode lines 22a. The etch back of layer 28 is similar to the etch back of layer 22, which was described previously. Note that electrode lines 28a also have an elongated central depression. As as alternative, a polycide layer can be formed on electrode lines 28a.

Figure 10:
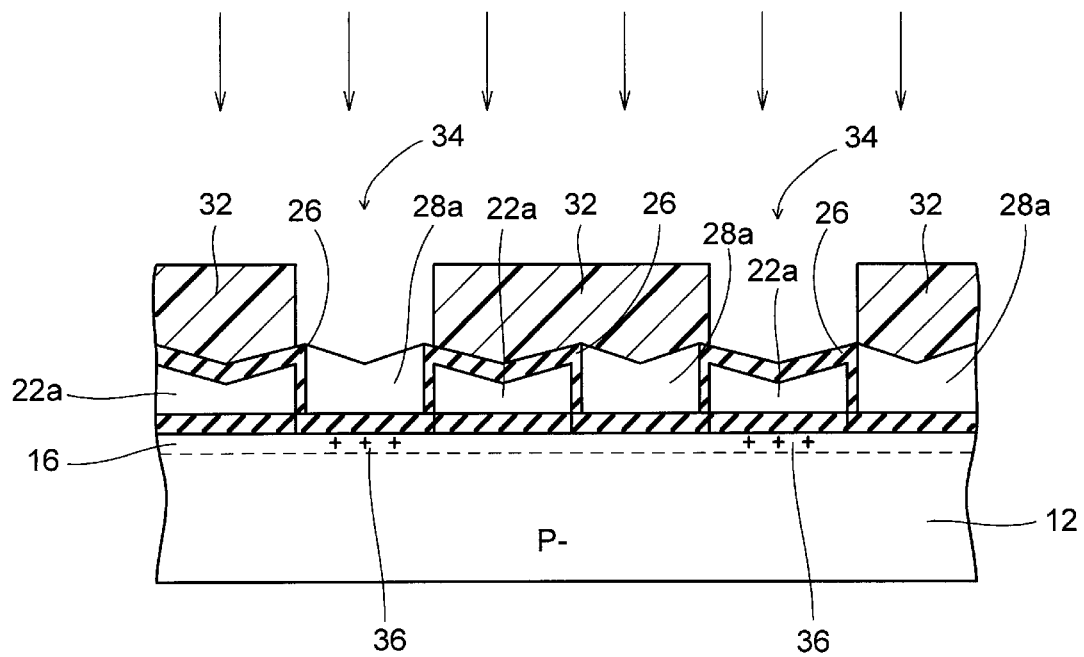
Figure 11:
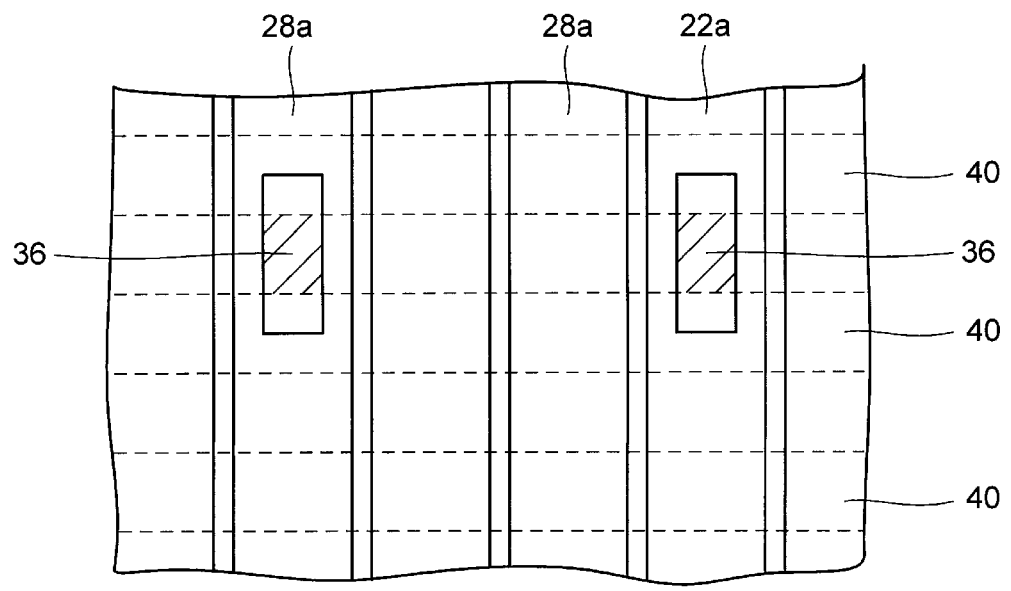
FIG. 11 is a top plan view of the ROM device of the invention that illustrates the location of code implants relative to the gate electrodes.

As shown in FIG. 10, a layer 32 of photoresist is deposited over the electrode lines; exposed; and developed to form the desired code implant pattern to tailor the ROM device to a specific application. The layer 32 is shown with openings 34. Impurity ions of a first type impurity, i. e. P type, are then implanted in the top surface of substrate, through openings 34, to neutralize the second type ions in depletion layer 16. The implantation voltage is carefully selected so that the ions are implanted in the substrate 12 mainly beneath the central elongated depressions in gate electrode lines 22a and 28a. The electrode line shape thus provides a self alignment function during the code implantation. This is illustrated more clearly in FIG. 11 wherein code implants 36 are located centrally of gate electrode lines 22a and 28a between diffused bit lines 40. Typically the impurity of the code implant is boron which is implanted at a voltage in the range of between about 80 and 150 KeV with a dosage of approximately 5 E 13 to 2 E 14 $cm^{-2}$.

Suitable interconnection metallurgy for operatively joining the various elements of the device is well known and can be formed before the code implant. This permits tailoring the ROM to a customer's application after the devices have been completed. For this "after-metal" programming process, a thin layer of borophosphosilicate glass (BPSG) is formed with a thickness of between about 500 and 2000 Angstroms, followed by suitable interconnection metallurgy, prior to the ROM code photoresist/implant processes.

It is believed apparent that various modifications can be made to the ROM process and structure of the invention without departing from the spirit of the invention. For example, the substrate can have a background doping of either P or N type impurities. In addition, a well can be formed by implant and drive-in to define a doped region in the substrate smaller than the entire substrate.

While the invention has been particularly shown and described with reference to the preferred embodiments thereof, it will be understood by those skilled in the art that various changes in form and detail may be made therein without departing from the spirit and scope of the invention.

What is claimed is:

1. A ROM comprising:

a silicon substrate provided with a background first type impurity;

a gate oxide layer on the surface of said substrate;

a plurality of spaced elongated first gate electrodes of polycrystalline silicon on said gate oxide layer, said first electrodes each having an elongated central depression;

a plurality of elongated second gate electrodes of polycrystalline silicon on said gate oxide layer, said plurality of elongated second gate electrodes positioned alternately between said plurality of spaced elongated first gate electrodes, said second gate electrodes each having an elongated central depression, wherein the first gate electrodes are separated from the second gate electrodes only by a layer of polysilicon oxide intergate dielectric; and code implant regions in said substrate located centrally of said first and second electrodes in registry with said central depressions, said code implant regions not extending laterally beyond said first and second electrodes.

2. The device of claim 1, wherein the first gate electrodes and the second gate electrodes do not overlap.

3. A ROM having NAND type memory cells, comprising:

a silicon substrate provided with a background doping of a first type impurity;

a depletion layer of a second type impurity adjacent a surface of said substrate;

a gate oxide layer on the surface of said substrate;

a plurality of spaced elongated first gate electrodes of polycrystalline silicon on said gate oxide layer, said first electrodes each having a thickness in the range of 2000 to 4000 Angstroms, a width in the range of 0.3 to 0.8 micrometers and an elongated central depression;

a plurality of elongated second gate electrodes of polycrystalline silicon on said gate oxide layer, said plurality of elongated second gate electrodes positioned alternately between said plurality of spaced elongated first gate electrodes, said second gate electrodes each having an elongated central depression; and code implant regions doped with the first type impurity in said depletion layer of said substrate and located centrally of said first and second electrodes in registry with said central depressions, said code implant regions not extending laterally beyond said first and second electrodes.

4. A ROM having NAND type memory cells, comprising:

a silicon substrate provided with a background doping of a first type impurity;

a depletion layer of a second type impurity adjacent a surface of said substrate;

a gate oxide layer on the surface of said substrate;

a plurality of spaced elongated first gate electrodes of polycrystalline silicon on said gate oxide layer, said first electrodes each having an elongated central depression;

a plurality of elongated second gate electrodes of polycrystalline silicon on said gate oxide layer, said plurality of elongated second gate electrodes positioned alternately between said plurality of spaced elongated first gate electrodes, said second gate electrodes each having an elongated central depression;

a layer of polysilicon oxide separating the first gate electrodes from the second gate electrodes; and code implant regions doped with the first type impurity in said depletion layer of said substrate and located centrally of said first and second electrodes in registry with said central depressions, said code implant regions not extending laterally beyond said first and second electrodes.

5. A ROM having NAND type memory cells, comprising:

a silicon substrate provided with a background doping of a first type impurity;

a depletion layer of a second type impurity adjacent a surface of said substrate;

a gate oxide layer on the surface of said substrate;

a plurality of spaced elongated first gate electrodes of polycrystalline silicon on said gate oxide layer, said first electrodes each having a thickness in the range of 2000 to 4000 Angstroms, a width in the range of 0.3 to 0.8 micrometers and an elongated central depression;

a plurality of elongated second gate electrodes of polycrystalline silicon on said gate oxide layer, said plurality of elongated second gate electrodes positioned alternately between said plurality of spaced elongated first gate electrodes, said second gate electrodes each having an elongated central depression; and code implant regions self-alignedly doped with the first type impurity in said depletion layer of said substrate and located centrally of said first and second electrodes in registry with said central depressions, said code implant regions not extending laterally beyond said first and second electrodes.

6. A ROM having NAND type memory cells, comprising:

a silicon substrate provided with a background doping of a first type impurity;

a depletion layer of a second type impurity adjacent a surface of said substrate;

a gate oxide layer on the surface of said substrate;

a plurality of spaced elongated first gate electrodes of polycrystalline silicon on said gate oxide layer, said first electrodes each having an elongated central depression;

a plurality of elongated second gate electrodes of polycrystalline silicon on said gate oxide layer, said plurality of elongated second gate electrodes positioned alternately between said plurality of spaced elongated first gate electrodes, said second gate electrodes each having an elongated central depression;

a layer of polysilicon oxide separating the first gate electrodes from the second gate electrodes; and code implant regions self-alignedly doped with the first type impurity in said depletion layer of said substrate and located centrally of said first and second electrodes in registry with said central depressions, said code implant regions not extending laterally beyond said first and second electrodes.

* * * * *